United States Patent
Takeuchi et al.

(10) Patent No.: US 6,570,096 B2
(45) Date of Patent: May 27, 2003

(54) PRODUCTION METHOD OF $NB_3AL$ SUPERCONDUCTING MULTIFILAMENTARY WIRE

(75) Inventors: Takao Takeuchi, Ibaraki (JP); Nobuya Banno, Ibaraki (JP); Toshihisa Asano, Ibaraki (JP); Hitoshi Wada, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 60 days.

(21) Appl. No.: 09/864,228

(22) Filed: May 25, 2001

(65) Prior Publication Data

US 2002/0037815 A1 Mar. 28, 2002

(30) Foreign Application Priority Data

May 26, 2000 (JP) ........................................ 2000-157341

(51) Int. Cl.⁷ ........................... H01B 12/00; H01L 39/24
(52) U.S. Cl. .................... 174/125.1; 505/806; 505/815; 420/901; 29/599; 148/98 OR
(58) Field of Search ................................. 505/806, 815; 420/901; 29/599; 174/125.1; 148/98 OR

(56) References Cited

U.S. PATENT DOCUMENTS

| | | | | |
|---|---|---|---|---|
| 4,088,512 A | * | 5/1978 | Pickus et al. ........... | 148/11.5 F |
| 4,917,965 A | * | 4/1990 | Inoue et al. ................ | 428/614 |
| 5,628,835 A | * | 5/1997 | Tada et al. ..................... | 148/98 |
| 6,372,054 B1 | * | 4/2002 | Kikuchi et al. ............... | 148/98 |
| 6,376,099 B1 | * | 4/2002 | Inoue et al. ................ | 428/615 |

* cited by examiner

*Primary Examiner*—Mark Kopec
(74) *Attorney, Agent, or Firm*—Wenderoth, Lind & Ponack, L.L.P.

(57) ABSTRACT

This invention provides a production method of $Nb_3Al$ superconducting multifilamentary wire based on rapid-heating, quenching and transformation method, capable of producing a high-performance $Nb_3Al$ superconducting multifilamentary wire by improving critical temperature thereof, upper critical field and critical current density. Upon a first stage heat treatment of beating a composite, in which bcc phase Nb—Al supersaturated solid solution is dispersed in Nb matrix, the bcc phase Nb—Al supersaturated solid solution ordered in temperature rise process is made disordered at an initial phase thereof and a non-reacting portion located adjacent is heated using a reaction heat generated when transforming this disordered bcc phase to A15 phase. Then, disordering of the bcc phase is promoted while propagating a high-temperature transformation region so as to automatically progress high-temperature beat treatment. As a result, a reaction-transformation is caused to block stacking fault from being generated in the A15 phase and crystal grain from being coarse and then, a second stage heat treatment for improving a long range ordering of the A15 phase is carried out.

8 Claims, 2 Drawing Sheets

PRODUCTION METHOD OF NB₃AL SUPERCONDUCTING MULTIFILAMENTARY WIRE

BACKGROUND OF THE INVENTION

1. Field of the Invention

The present invention relates to a production method of $Nb_3Al$ superconducting multifilamentary wire and more particularly to a production method of $Nb_3Al$ superconducting multifilamentary wire by the rapid-heating, quenching and transformation(RHQT) processing, capable of improving critical temperature $T_c$, upper critical field $B_{c2}$ and critical current density $J_c$.

2. Description of the Related Art

As compared to an ordinary superconducting wire such as $Nb_3Sn$ and NbTi, the RHQT $Nb_3Al$ superconducting multifilamentary wire has more excellent critical current density characteristic and strain tolerance characteristic in a high magnetic field. Thus, it is expected that this wire will be applied to a large-scale superconducting applications, such as a fusion reactor and a high-energy accelerator, in which a large electromagnetic force is applied to a superconducting wire thereof itself.

Conventionally, after heating the Nb/Al multifilamentary composite wire produced by the Jerry Roll (JR) method or Rod-in-Tube (RIT) method up to Nb(Al) bcc solid solution region at about 1,900° C. quickly, it is quenched to produce a composite wire, in which supersaturated solid solution $Nb(Al)_{ss}$ filament having Nb-25 at % Al composition is dispersed in Nb matrix thereof, and this $Nb(Al)_{ss}$ is transformed at a temperature of 700–800° C. to produce $Nb_3Al$ superconducting multifilamentary wire. In such $Nb_3Al$ superconducting multifilamentary wire, crystal grain of A15 type $Nb_3Al$ generated by transformation is as small as several tens nm and this grain boundary serves as the center of main pinning for fluxoid, so that Jc is extremely high.

Further, for the $Nb_3Al$ superconducting multifilamentary wire, external stabilization method of applying Cu foil as a stabilizer by mechanical clad processing after quenching has been developed using the fact that a supersaturated solid solution has an excellent deformability at room temperature. This Cu clad processing has an advantage that deformation of the saturated solid solution improves Jc after transformation about twice.

However, by the conventional transformation heat treatment method for production of $Nb_3Al$ superconducting multifilamentary wire, Tc of the resultant $Nb_3Al$ compound is 17.8 K and $B_{cz}$ (4.2 K) at a middle point of a resistance transition curve is 26 T. If the deformation amount in clad processing exceeds 40% in terms of section reduction ratio, Jc begins to deteriorate. Then, in deformation at about 40%, sufficient adhesion cannot be secured between Cu and the quenched wire, so that an electric resistance of interface is so high that the Cu has not acted enough as the stabilizer.

On the other hand, in order to enhance $T_c$ more than 18.3 K or $B_{cz}$ (4.2 K) more than 29 T, it has been found effective to heat the Jerry-Roll (JR) or Rod-in-Tube (RIT) Nb/Al composite multifilamentary wire to generate disorder A15 type $Nb_3Al$ phase in it by direct diffusion at a high temperature of 1700–1900° C. and subsequentry carry out the second stage heat treatment to improve the long range ordering at 700–800° C.

However, in this case, the Cu stabilizer cannot be applied by clad processing because the resulted wire is mechanically brittle and further, the crystal grain of $Nb_3Al$ becomes coarse. Thus, there is such a defect that the Jc at a low magnetic field is significantly deteriorated.

SUMMARY OF THE INVENTION

Accordingly, the present invention intends to solve the above-described problems of the conventional art and provide a production method for a high-performance $Nb_3Al$ superconducting multifilamentary wire based on rapid-heating, quenching and transformation method, in which critical temperature, upper critical magnetic field and critical current density are improved.

To achieve the above-described object, according to a first aspect of the present invention, there is provided a production method for $Nb_3Al$ superconducting multifilamentary wire based on rapid-heating and quenching method, wherein upon a first stage heat treatment of heating a composite, in which bcc phase Nb—Al supersaturated solid solution is dispersed in Nb matrix, the bcc phase Nb—Al supersaturated solid solution ordered in temperature rise process is made disorder at an initial phase thereof, a non-reacting portion located adjacent is heated using a reaction heat generated when transforming this disordered bcc phase to A15 phase, disorder of the bcc phase is promoted while propagating a high-temperature transformation region to automatically progress high-temperature heat treatment thereby causing a transformation to block stacking fault from being generated in the A15 phase and crystal grain from being coarse and then, a second stage heat treatment for improving a long range ordering of the A15 phase is carried out.

According to a second aspect of the present invention, there is provided a production method for $Nb_3Al$ superconducting multifilamentary wire according to the first aspect wherein the temperature of the first stage heat treatment is 850–1,100° C. and holding time thereof is 1 second-1 hour.

According to a third aspect of the present invention, there is provided a production method for $Nb_3Al$ superconducting multifilamentary wire according to the first or second aspect wherein the temperature of the second stage heat treatment is 650–800° C. and holding time thereof is 3–200 hours.

According to a fourth aspect of the present invention, there is provided a production method for $Nb_3Al$ superconducting multifilamentary wire according to the first-third aspect wherein volume ratio of bcc phase Nb—Al supersaturated solid solution with respect to Nb matrix is 0.1–3.

According to a fifth aspect of the present invention, there is provided a production method for $Nb_3Al$ superconducting multifilamentary wire according to the first-fourth aspect wherein the bcc phase Nb—Al supersaturated solid solution is subjected to mechanical deformation of 1–90% in terms of section reduction ratio.

According to a sixth aspect of the present invention, there is provided a production method for $Nb_3Al$ superconducting multifilamentary wire according to the first-fifth aspect wherein Cu is applied to the surface of a composit, in which the bcc phase Nb—Al supersaturated solid solution is dispersed in Nb matrix, as a stabilizer by clad processing or electric plating.

According to a seventh aspect of the present invention, there is provided a production method for $Nb_3Al$ superconducting multifilamentary wire according to the first-sixth aspect wherein Ag or Cu as a stabilizer is isolated with Nb diffusion barrier from the bcc phase Nb—Al supersaturated solid solution within the composite, in which the bcc phase Nb—Al supersaturated solid solution is dispersed in the Nb matrix.

According to an eighth aspect of the present invention, there is provided a production method for Nb$_3$Al superconducting multifilamentary wire according to the first-seventh aspect wherein when by adding an element M to the bcc phase Nb—Al supersaturated solid solution by alloying, composition thereof is expressed with Nb$_y$ (Al$_{1-x}$M$_x$)$_{1-y}$, if the added element is Ge, it is 0.05–0.2 while if the added element is Si, it is 0.05–0.15.

According to a ninth aspect of the present invention, there is provided a production method for Nb$_3$Al superconducting multifilamentary wire according to the first-eighth aspect wherein a composit in which the bcc phase Nb—Al supersaturated solid solution is dispersed in the Nb matrix is wound in the form of coil.

The present invention has been achieved based on knowledge of the inventor as follow.

That is, the inventor of the present invention has made efforts for optimizing transformation technology for Nb$_3$Al wire to be produced according to the rapid-heating, quenching and transformation method. As a result, it has been found that under the conventional transformation method, order reaction of a supersaturated solid solution and transformation reaction to the A15 phase are progressed in competition with each other. Further, the superconducting characteristic of Nb$_3$Al compound maybe deteriorated by transformation from such ordered bcc phase. If the bcc phase is ordered, the A15 phase ordered to some extent from the beginning is transformed and it is estimated that the A15 phase generated in such a manner contains a large amount of stacking faults. The inventor estimated that if the supersaturated solid solution ordered in temperature rise process was made disorder again, deterioration of the superconducting characteristic could be suppressed. Then, he tried making disorder the supersaturated solid solution and transformation from that state by heating up to a predetermined temperature, which is higher than conventionally, namely, 850° C.–1,100° C., preferably 900° C.–1,050° C. As a result, it was found that (1) such heat treatment method did not order the supersaturated solid solution just until the transformation was started, (2) the temperature of the specimen was raised from several tens ° C. to several hundreds ° C. by a reaction heat of the transformation, (3) nucleated transformation was propagated throughout the specimen immediately, and (4) if the transformation was completed, the specimen temperature turned down to a predetermined temperature before the transformation immediately.

The present invention provides a new two-stage heat treatment method using this phenomenon (reaction-transformation).

Figure 1:
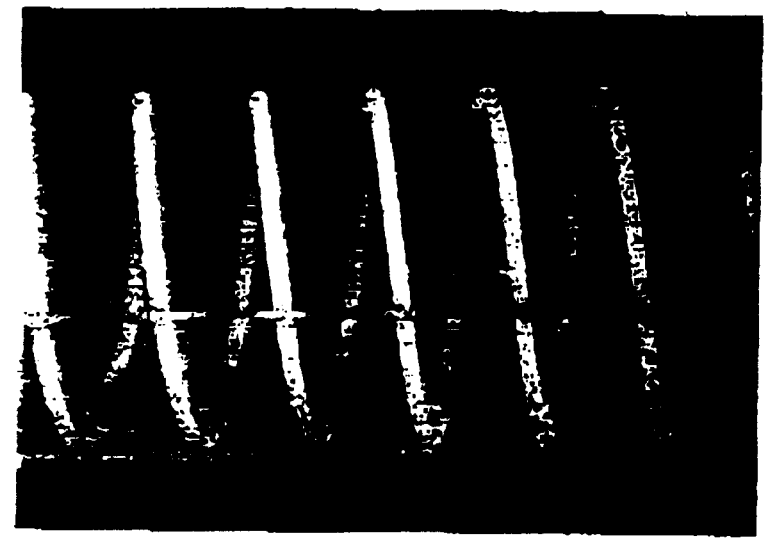
FIG. 1 is a view showing the state of reaction changes observed when wire, in which bcc phase supersaturated solid solution is dispersed in Nb matrix thereof, is formed to flat type in the form of tape and this is inserted into a gold mirror electric furnace heating portion kept at 1,000° C. so as to carry out heat treatment for a minute. If the left end is ignited, a heated transformed region (A) is propagated to the right end 10 cm apart in about 2 seconds, so that high-temperature short time heat treatment is automatically terminated.
Figure 1:
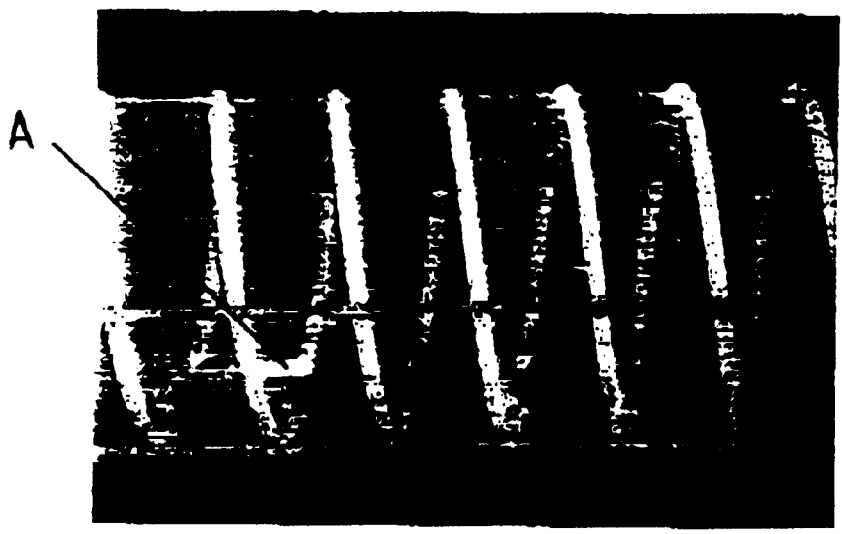
Figure 1:

Diffraction lines of (100) plane and (111) plane, which are forbidden reflection of bcc phase, appear after heat treatment for a minute. It is evident that the texture of the (100) plane coincides with that of (200) plane and thereby that diffraction peak in which 2θ is 27.18° is forbidden reflection at the bcc phase. Therefore, in an ordinary transformation method, supersaturated solid solution is ordered first and then transformed to A15 phase.

DESCRIPTION OF THE PREFERRED EMBODIMENTS

The present invention has the above-described features and the preferred embodiment of the invention will be described in detail.

To manufacture a high-performance Nb$_3$Al superconducting multifilamentary wire according to the rapid-heating, quenching method of the present invention, it is important to transform from a state in which Al atom of Nb—Al supersaturate solid solution at bcc phase is dissolved disorderly to A15 phase. For the purpose, it is necessary to hold the supersaturated solid solution, which is ordered during temperature rise at a high temperature more than 850° C. first so as to achieve disorder and make complete the disorder of the bcc phase using reaction-transformation. The temperature for first stage heat treatment is desired to be 850° C. or more, when the disorder of the supersaturated solid solution begins and particularly desired to be 900° C. or more, which terminates the reaction-transformation at a higher temperature in a shorter time. On the other hand, because if the first stage heat treatment temperature rises too high, the holding time becomes shorter than 1 second, so that heat treatment control is difficult, the first stage heat treatment temperature is desired to be 1,100° C. or less and particularly desired to be 1,050° C. or less for Cu stabilizer not to be melted by a reaction-transformation. It is desired to adjust the first stage heat treatment time shorter than an hour in order to block the transformed crystal grain of A15 phase from being coarse.

In the first stage heat treatment accompanying reaction-transformation, the disordering of the supersaturated solid solution is enhanced by generated heat so that the transformation from the disordered supersaturated solid solution is made complete. Thus, deterioration of superconductivity, which may be caused by the ordering of the supersaturated solid solution, can be suppressed.

The feature of the first stage heat treatment is that the aforementioned reaction heat upon transforming the initially disordered bcc phase to the A15 phase raises the temperature of a non-reacting portion located adjacent so as to enhance the disordering of the bcc phase while propagating a high-temperature transformation region, so that the reaction-transformation by high-temperature heat treatment is automatically progressed.

Further, the present invention has such a feature that the superconductivity is not sensitive to time for the first stage heat treatment carried out at 850° C.–1,100° C., which is a desirable range as ignition temperature. This fact serves advantageously as an commertial heat treatment method. This is because scattering in the superconductivity resulting from time of the first stage heat treatment is expected to be small when carrying out the reaction-transformation processing on a continuous long wire. Such a time insensitivity enables application of wind and react method in which supersaturated solid solution/multifilamentary wire wound in the form of pan-cake coil is reaction-transformed by heating quickly to 850° C.–1,050° C.

This transformation heat treatment method is also effective to transformation processing on a supersaturated solid solution to which Ge or Si is added as a third element.

The temperature of the second stage heat treatment is desired to be 800° C. or less to improve a long-range ordering. If the second stage heat treatment temperature is less than 650° C., the heat treatment time necessary for improving the long-range ordering becomes more than 200 hours, thereby increasing production cost. However, it needs more than three hours for improvement of the long-range ordering at 800° C.

Because heat generation by the transformation raises the temperature of the Nb matrix, which does not contribute to the reaction, volume ratio of the supersaturated solid solution needs to be as large as to some extent to propagate a transformation region through the reaction-transformation. The volume ratio of the supersaturated solid solution with respect to the Nb matrix is desired to be 0.1 or more. From standpoint for improvement of Jc per total cross sectional area, preferably, it is 0.3 or more. On the other hand, if the volume ratio of the supersaturated solid solution with respect to the Nb matrix exceeds 3, mechanical reinforcement by the Nb matrix at the time of carrying out the rapid-heating, quenching processing becomes insufficient, thereby making it difficult to produce the supersaturated solid solution/mult-core wire.

Mechanical deformation of the supersaturated solid solution completes the reaction-transformation in a short time and raises the supersaturated solid solution to a high temperature spontaneously. Thus, the A15 phase having no stacking fault can be generated by transformation from the disordered supersaturated solid solution, so that the superconductivity is improved significantly. Thus, the mechanical deformation of 1% or more is absolutely necessary. If deformation at 40–90% in terms of cross section reduction ratio is made at Cu clad processing, electric resistance at interface between the Cu and the as-quenched material decreases extremely, thereby acting as a stabilizer effectively. On the other hand, if the deformation strain exceeds 90%, abnormal deformation (sausaging) of the supersaturated solid solution filament occurs, so that n index of current/voltage characteristic and Jc itself deteriorate.

If the quantities of additional Ge and Si to the Bcc phase supersaturated solid solution exceed 20 at %, 15 at % respectively, workability of Nb/Al alloy composite before quick cooling is deteriorated. On the other hand, addition of at least 5 at % each is desirable for Ge and Si dissolved to the A15 phase after the transformation to cause a remarkable improvement of superconductivity.

If the second stage heat treatment is carried out at 650–800° C. after the reaction-transformation so as to the long range ordering, for example, Tc turns to 18.3 K and $B_{c2}$ (4.2 K) turns to 29 T, which are 0.5 K and 3 T higher than the conventional transformation method assures. Further, because this reaction-transformation is terminated in a short time, it is possible to block crystal grain from being coarse. Contrary to generation by direct diffusion of the disordered A15 phase at a high temperature, Jc in low magnetic field is not deteriorated. Consequently, $Nb_3Al$ superconducting multifilamentary wire according to high-performance, the rapid-heating, quenching and transformation (RHQT) method can be manufactured, where the Jc-B characteristic of the conventional transformation method is sifted in parallel to the side of the high magnetic field by as high as 3T.

What should be noted is that as for the deformation rate of the quick cooling material, Jc is not deteriorated up to 90% in terms of cross section reduction ratio, while as the deformation ratio increases, critical values of Tc, Bc, Jc are improved. According to the prior art, if mechanical distortion is applied by processing the supersaturated solid solution, not only the transformation to the A15 phase is enhanced, but also ordering of the supersaturated solid solution is enhanced in the transformation processing under 700–800° C. Therefore, if a processing distortion of more than 40% is applied, the ordering of the supersaturated solid solution becomes conspicuous thereby deteriorating Jc. However, in the transformation processing under 850° C.-1, 100° C. as mentioned in the present invention, the supersaturated solid solution, which is ordered in a temperature rising process, can be made disordered again, so that Jc deterioration due to deformation strain does not occur. Therefore, the deformation amount in processing of the Cu clad can be increased. As a result, there is produced a spillover effect that adhesion with Cu is improved so that the function as a stabilizer can be largely improved.

As described above, the present invention provides new two-stage heat treatment method using the reaction-transformation phenomenon newly found by the inventor of the present invention. According to this reaction-transformation method, in the first stage heat treatment, the disordering of the supersaturated solid solution is promoted by heat generation thereby making complete the transformation from the disordered supersaturated solid solution. Therefore, this suppresses deterioration of the superconductivity, which may be caused by the ordering of the supersaturated solid solution. If the long range ordering is improved by carrying out heat treatment through two stages under, for example, 650–800° C. after the reaction-transformation, as compared to the conventional transformation method, it can be shifted by as high as 3T to the side of high magnetic field without decreasing the slope of the Jc-B curve. As a result, production of 1-GHz NMR magnet under operation at 4.2 K is enabled.

The method of the present invention is effective for particularly, the high magnetic field of the rapid-heating, quenching $Nb_3Al$ wire to which Cu is applied as a stabilizer by mechanical clad processing. Because the conventional transformation method optimizes Jc, the deformation at cladding could not be allowed more than 40% in terms of cross section reduction ratio and therefore, mechanical and electric contactness between Cu and as-quenched material were not always sufficient.

Contrary to this, according to the method of the present invention, Jc gets improved up to 90% in deformation ratio, which is higher than the conventional method capable of improving adhesion. Therefore, in addition to the improvement of the superconductivity of the Cu clad wire material, the present invention can achieve improvement of stability by reducing the interface resistance.

The two-stage heat treatment in which after heat treatment at a high temperature, heat treatment of the second time is carried out to improve the long range ordering at a low temperature has been established as a heat treatment method for manufacturing $Nb_3Al$ by making the Nb/Al composit react by direct diffusion. However, high-temperature, short time heat treatment proposed in the present invention can be said to be unique in such a point that heat generation accompanied by transformation is utilized for disordering of the supersaturated solid solution in heat treatment of the first stage and this heat treatment is automatically progressed by using propagation through the transformation region.

According to the present invention using the reaction-transformation method, high-performance $Nb_3Al$ superconductivity multifilamentary wire is produced by heating quickly and cooling quickly the bcc supersaturated solid solution phase:$Nb(Al)_{ss}$ composite enbedded in the Nb matrix. Although the embodiment of the present invention describes about the Nb/Nb(Al)$_{ss}$ composit produced by, mainly, Jerry-Roll (JR) method and Rod-in-Tube (RIT) method, the same effect can be obtained when the Nb/Al composit produced by the clad chip extruding method, power extruding method is rapidly heated and quenched to form the Nb/Nb(Al)$_{ss}$ composit.

Then, the examples of the present invention will be shown below and described in detail. Of course, the present invention is not limited to these examples.

EXAMPLES

Example 1

A JR Nb/Nb(Al)$_{ss}$ composit wire (diameter: 1.24 mm), in which the bcc phase Nb—Al supersaturated solid solution (Nb(Al)$_{ss}$) is enbedded in the Nb matrix produced by rapid-heating and quenching the JR processed Nb/Al composite, was subjected to the first-stage heat treatment at 1,000° C. for a minute and subsequently subjected to the second stage heat treatment at 800° C. for 10 hours. Meanwhile, the reaction-transformation occurred 30 seconds after holding at 1,000° C. As shown in Table 1, as compared to standard specimen 2 produced according to the conventional transformation method, Tc, $B_{c2}$ (4.2 K) and Jc were improved largely.

Example 2

10 cm of a flat type JR Nb/Nb(Al)$_{ss}$ wire (cross section reduction ratio: 30% and 90%) produced by rolling with a flat roll a composite wire, in which the bcc phase Nb—Al supersaturated solid solution (Nb(Al)$_{ss}$) is dispersed in the Nb matrix produced by rapid-heating and quenching the JR processed Nb/Al composite, was inserted into a gold-mirror electric furnace held at 1,000° C. as the first stage heat treatment. Consequently, as shown in FIG. 1, a transformation region (A) ignited at a left-side end thereof was propagated toward the other (right-side) end about 10 seconds and 6 seconds after, which were earlier than the example 1, in 800° C. in 10 hours, the superconductivity was improved remarkably as compared to a specimen heat-treated according to an ordinary transformation method as shown in Table 1.

Figure 2:
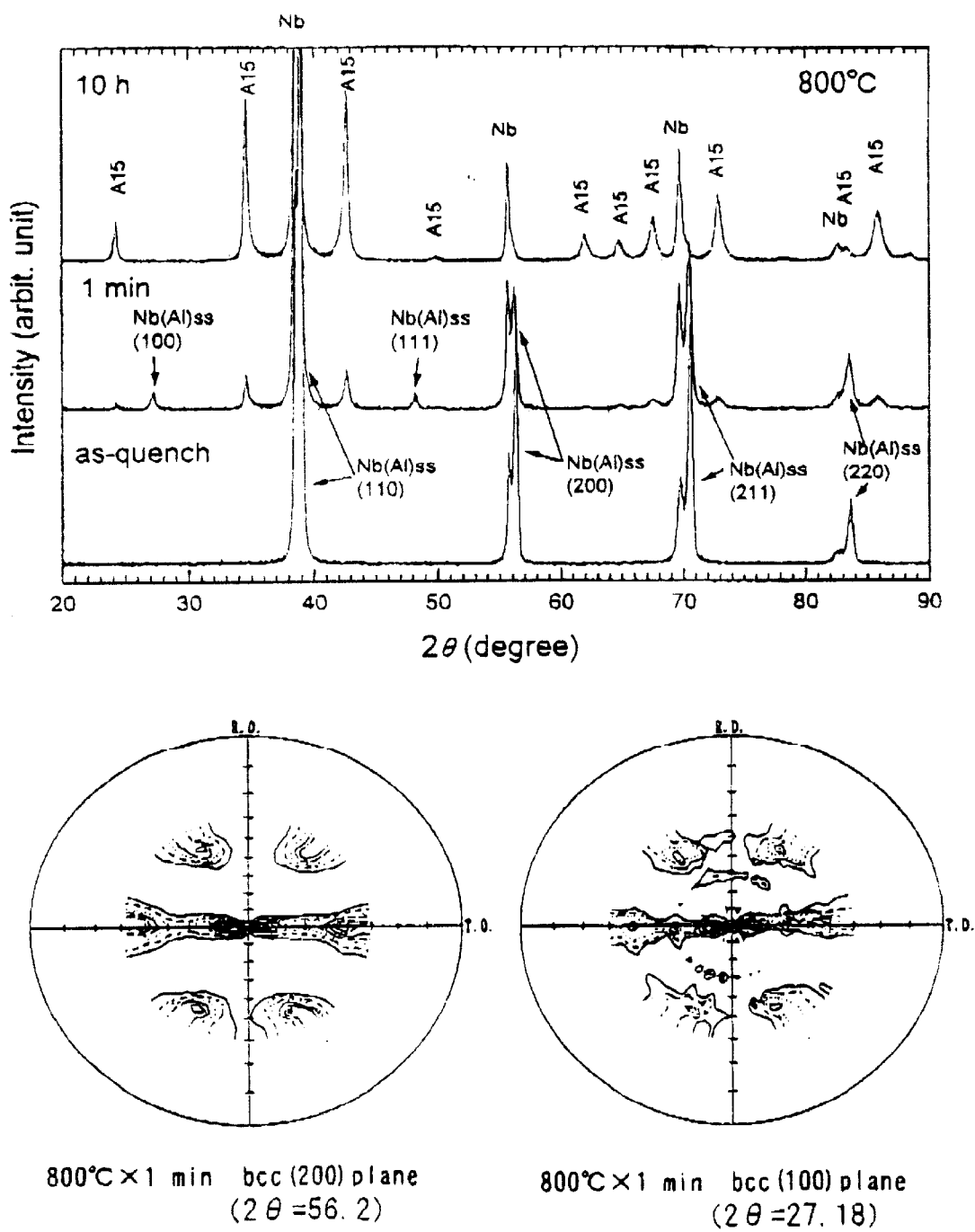
FIG. 2 is a diagram showing X-ray diffraction observed when wire, in which bcc phase supersaturated solid solution is dispersed in Nb matrix, is formed to flat type in the form of tape and this is heat-treated at 800° C. for a minute and 10 hours.

As evident from the standard specimens 3, 4, according to the ordinary transformation method, an optimum value of the deformation of the supersaturated solid solution was 30–40%. However, as evident from comparison with the examples 1, 2-1, 2-2 of Table 1, the present invention has an important feature that as the deformation of the saturated solid solution increases, the superconductivity is more improved. The reason can be considered as follows: under the ordinary transformation method, the ordering of the supersaturated solid solution is progressed during temperature rise, and the larger the deformation, the more remarkable the ordering of the solid solution becomes. The deformation of the supersaturated solid solution has another effect of promoting the transformation and therefore, conventionally, the superconductivity was kept optimum when the deformation amount was 30–40%. As shown in FIG. 2, the forbidden reflection was observed on the (100) plane and (111) plane in the conventional transformation heat treatment at 700° C. or 800° C., thereby indicating that the orderig of the supersaturated solid solution had been completed before the transformation to Nb$_3$Al occaured. On the other hand, as for the first stage heat treatment at 1,000° C., if a specimen heat-treated for four seconds just before ignition was investigated with X-ray diffraction, no forbidden reflection appeared on the (100) plane and (111) plane of the bcc phase. That is, it can be considered that the orderd bcc phase becomes disordered again at 1,000° C. as the temperature rises. Further, it can be considered that because the the reaction-transformation completed transformation from the disordered bcc phase to the A15 phase, the formation of the A15 phase not including the stacking fault is enabled so that the superconductivity is improved remarkably.

TABLE 1

|  | Standard Specimen 1 | Standard Specimen 2 | Standard Specimen 3 | Standard Specimen 4 | Example 1 | Example 2-1 | Example 2-2 | Example 2-3 |
| --- | --- | --- | --- | --- | --- | --- | --- | --- |
| volume ratio of supersaturated solid solution with respect to Nb stabilizer | 1.25 | 1.25 | 1.25 | 1.25 | 1.25 | 1.25 | 1.25 | 1.25 |
|  | — | — | Cu clad | Cu clad | — | — | — | — |
| deformation amount of supersaturated solid solution | — | — | 30% | 70% | — | 30% | 70% | 70% |
| first stage heat treatment | 800° C. × 5 minutes | 800° C. × 10 h | 800° C. × 10 h | 800° C. × 10 h | 1000° C. × 60 sec | 1000° C. × 60 sec | 1000° C. × 60 sec | 1000° C. × 4 sec |
| formed phase after first stage heat treatment | order bcc A15 | A15 | A15 | A15 | A15 | A15 | A15 | disorder bc |
| presence/absence of reaction-transformation (time required for ignition) | none | none | none | none | yes (30 seconds) | yes (10 seconds) | yes (6 seconds) | none |
| second stage heat treatment | — | — | — | — | 800° C. × 10 h | 800° C. × 10 h | 800° C. × 10 h | 800° C. × 10 h |
| Tc (K) | 12 | 17.8 | 17.8 | 17.4 | 18.1 | 18.2 | 18.3 | 17.8 |
| Bc2 (4.2 K) | 11 | 26 | 26.5 | 25 | 28 | 28.5 | 29 | 26 |
| Jc(4.2 K) at 20 T(A/mm2) | 0 | 230 | 345 | 240 | 500 | 600 | 650 | 240 |
| Jc(4.2 K) at 24 T(A/mm2) | 0 | 14 | 20 | 11 | 100 | 140 | 180 | 15 | about 2 seconds and the high-temperature short time heat treatment was automatically completed. Time used for heating respective parts of the specimen was less than 0.3 seconds. If the specimen subjected to the first heat treatment was subsequently subjected to the second heat treatment at

Example 3

A flattened JR Nb/Nb(Al)$_{ss}$ composite wire, in which the bcc phase Nb—Al supersaturated solid solution (Nb(Al)$_{ss}$) was dispersed in the Nb matrix produced by rapid-heating and quenching the Nb/Al composite, was heated at 900° C. for five minutes, where the temperature was raised as quickly as possible. After that, it was heat-treated at 800° C. for 10 hours. Although as indicated in Table 2, the ignition temperature was lower than the example 2, Tc was 18.1K and $B_{c2}$ (4.2 K) was 27.5T.

Example 4

A flat type wire to which Cu was applied as a stabilizer by clad processing with cross section reduction ratio 30%, 70% was subjected to the first stage heat treatment at 1,000° C. Because the heat capacity of Cu is large, the time needed for reaction-transformation ignition, which is observed as a rise of the surface temperature, is slightly retarded as compared to a specimen including no stabilizer. However, although the superconductivity is slightly worse as compared to a specimen containing no Cu, the improvement of the superconductivity is found sufficiently as compared to the aforementioned standard specimen as shown in Table 2. Further, the high magnetic field characteristic is slightly improved by lowering the second stage processing temperature to 700° C.

Example 5

After the flat type wire having the same configuration as the example 3 was heated to 900° C. quickly and heat-treated for five minutes, it was heat-treated at 800° C. for 10 hours. Although as indicated in Table 2, the ignition temperature is lower than the example 2 like the example 3, the superconductivity is improved as compared to the example 3 because the volume ratio of the supersaturated solid solution with respect to the Nb matrix is increased to 2.0.

Tc was improved to 18.9K. As a result, it was found that the present invention was valid for the transformation of the ternary system supersaturated solid solution.

Example 7

The Cu clad processed/supersaturated solid solution multifilamentary wire of 3 m long was insulated with $Al_2O_3$ fiber and this was wound in the form of solenoid around a stainless bobbin of 30 mm in diameter and then, subjected to the first stage heat treatment in a fluidized-bed furnace held at 1,000° C. using nitrogen gas for five minutes. Subsequently, the second stage heat treatment was carried out at 800° C. for 10 hours. As a result, Tc reached 18.1K, thereby indicating that despite the coil configuration, the superconductivity was improved by the reaction-transformation.

As described in detail above, enhancement of the superconductivity using the reaction-transformation method, which is a method of the present invention, is very conspicuous. The present invention has such advantages that not only it can utilize the conventional stabilization methods just as they are, but also it improves the contactness between Cu and as-quenched $Nb/Nb(Al)_{ss}$ composite for external stabilization technology. According to the present invention, it is possible that a 1 GHz NMR magnet shall can be operated at 4.2K.

In terms of the superconducting, the present invention indicates a critical current density more than twice the commercially utilized $Nb_3Sn$ wire and further an excellent strain tolerance characteristic. In the most region where $Nb_3Sn$ conductor is currently employed, the conductor may be replaced by the present invention. Additionally, it can be

TABLE 2

|  | Example 3 | Example 4-1 | Example 4-2 | Example 4-3 | Example 5 |
| --- | --- | --- | --- | --- | --- |
| volume ratio | 1.25 | 1.25 | 1.25 | 1.25 | 2.0 |
| stabilizer | — | Cu clad | Cu clad | Cu clad | — |
| deformation amount of supersaturated solid solution | 70% | 30% | 70% | 70% | 70% |
| first stage heat treatment | 900° C. × 5 min | 1000° C. × 90 sec | 1000° C. × 90 sec | 1000° C. × 90 sec | 1000° C. × 5 min |
| formed phase after first stage heat treatment | A15 | A15 | A15 | A15 | A15 |
| presence/absence of reaction-transformation (time required for ignition) | yes (30 seconds) | yes (85 seconds) | yes (40 seconds) | yes (40 seconds) | yes (30 seconds) |
| second stage heat treatment | 800° C. × 10 h | 800° C. × 10 h | 800° C. × 10 h | 700° C. × 50 h | 800° C. × 10 h |
| Tc (K) | 18.1 | 18.1 | 18.25 | 18.27 | 18.2 |
| Bc2 (4.2 K) | 27.5 | 27.5 | 29 | 29 | 28.5 |
| Jc (4.2 K) at 20 T (A/mm2) | 500 | 530 | 650 | 650 | 610 |
| Jc (4.2 K) at 24 T (A/mm2) | 100 | 100 | 160 | 170 | 130 |

Example 6

It has been reported that if Ge or Si is added to the A15 phase formed by direct diffusion reaction at high temperatures, Tc and $B_{c2}$ (4.2 K) exceed 20 K and 35 T respectively. However, even if the ternary system Nb—Al—Ge supersaturated solid solution produced by quenhing the RIT processed Nb/Al-15 at % Ge composite wire is subjected to the conventional transformation heat treatment, the resultant Tc is not higher than 18.2K. This is because, as well as the binary system, the ordering of the bcc phase occurs conspicuously during a temperature rise. Such as ordering can be considered to deteriorate the superconductivity. When heat treatment was carried out at 1000° C. for a minute as the first stage heat treatment condition, the reaction-transformation occurred. Thus, when the second stage heat treatment was carried out at 800° C. for 10 hours, expected that the present invention will allow the magnetic field in such a large scale superconducting system as a fusion reactor and a high-energy accelerator to increase and such system to be compact, thereby leading to a large reduction of construction cost.

What is claimed is:

1. A production method for $Nb_3Al$ superconducting multifilamentary wire based on rapid-heating, quenching method, wherein upon a first stage heat treatment of heating a composite in which bcc phase Nb—Al supersaturated solid solution is dispersed in Nb matrix, the bcc phase Nb—Al supersaturated solid solution ordered in temperature rise process is made disordered at an initial phase thereof, a non-reacting portion located adjacent is heated using a reaction heat generated when transforming this disordered bcc phase to A15 phase, disordering of the bcc phase is promoted while propagating a high-temperature transformation region to automatically progress high-temperature heat treatment thereby causing a reaction-transformation to block stacking fault from being formed in the A15 phase and crystal grain from being coarse, wherein the temperature of the first stage heat treatment is 850–1,100° C. and holding time thereof is 1 second-1 hour, and then, a second stage heat treatment for improving a long range ordering of the A15 phase is carried out.

2. A production method for $Nb_3Al$ superconducting multifilamentary wire according to claim 1 wherein the temperature of the second stage heat treatment is 650–800° C. and holding time thereof is 3–200 hours.

3. A production method for $Nb_3Al$ superconducting multifilamentary wire according to claim 1 wherein volume ratio of bcc phase Nb—Al supersaturated solid solution with respect to Nb matrix is 0.1–3.

4. A production method for $Nb_3Al$ superconducting multifilamentary wire according to claim 1 wherein the bcc phase Nb—Al supersaturated solid solution is subjected to deformation processing of 1–90% in terms of cross section reduction rate.

5. A production method for $Nb_3Al$ superconducting multifilamentary wire according to claim 1 wherein Cu is applied to a surface of the composite, in which the bcc phase Nb—Al supersaturated solid solution is dispersed in Nb matrix, as a stabilizer by clad processing or electric plating.

6. A production method for $Nb_3Al$ superconducting multifilamentary wire according to claim 1 wherein Ag or Cu as a stabilizer is isolated with Nb diffusion barrier from the bcc phase Nb—Al supersaturated solid solution within the composite, in which the bcc phase Nb—Al supersaturated solid solution is dispersed in the Nb matrix by the bcc phase Nb—Al supersaturated solid solution.

7. A production method for $Nb_3Al$ superconducting multifilamentary wire according to claim 1 wherein an element M selected from the group consisting of Ge and Si is added to the bcc phase Nb—Al supersaturated solid solution by alloying, to produce a composition expressed as $Nb_y(Al_{1-x}M_x)_{1-y}$, and if the added element is Ge, x is 0.05–0.2 while if the added element is Si, x is 0.05–0.15.

8. A production method for $Nb_3Al$ superconducting multifilamentary wire according to claim 1 wherein a composite in which the bcc phase Nb—Al supersaturated solid solution is dispersed in the Nb matrix is wound in the form of coil.

* * * * *